United States Patent
Wei et al.

(10) Patent No.: US 7,892,445 B1
(45) Date of Patent: Feb. 22, 2011

(54) WAFER ELECTRICAL DISCHARGE CONTROL USING ARGON FREE DECHUCKING GAS

(75) Inventors: David Wei, Mountain House, CA (US); Howard Dang, San Jose, CA (US); Masahiro Watanabe, Fort Collins, CO (US); Sean Kang, San Ramon, CA (US); Kenji Takeshita, Sunnyvale, CA (US); Mayumi Block, Sunnyvale, CA (US); Stephen Sirard, San Jose, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 731 days.

(21) Appl. No.: 11/853,968

(22) Filed: Sep. 12, 2007

(51) Int. Cl.
*B44C 1/22* (2006.01)

(52) U.S. Cl. .................. 216/67; 216/58; 216/74; 216/76

(58) Field of Classification Search .............. 216/58, 216/67, 74, 76
See application file for complete search history.

(56) References Cited

U.S. PATENT DOCUMENTS

| 7,029,594 B2 * | 4/2006 | Yasui et al. .................. 216/61 |
| 2006/0087793 A1 * | 4/2006 | Kim et al. .................. 361/234 |
| 2006/0213866 A1 * | 9/2006 | Hirotsu et al. .................. 216/67 |
| 2006/0219660 A1 * | 10/2006 | Nishimura et al. ............ 216/67 |
| 2009/0004873 A1 * | 1/2009 | Yang et al. .................. 438/729 |

* cited by examiner

*Primary Examiner*—Shamim Ahmed
(74) *Attorney, Agent, or Firm*—Beyer Law Group LLP

(57) ABSTRACT

A method of dechucking a wafer, with a low-k dielectric layer, held onto an electrostatic chuck by an electrostatic charge in a plasma chamber is provided. The electrostatic clamping voltage is removed. An essentially argon free dechucking gas is provided into the plasma chamber. A dechucking plasma is formed from the dechucking gas in the plasma chamber. The dechucking plasma is stopped.

20 Claims, 4 Drawing Sheets

WAFER ELECTRICAL DISCHARGE CONTROL USING ARGON FREE DECHUCKING GAS

BACKGROUND OF THE INVENTION

The present invention relates to the handling of a substrate wafer in the manufacture of an integrated circuit. More particularly, the present invention relates to a method for controllably discharging an electrical charge remaining on a substrate in a plasma processing chamber during wafer processing.

Substrates, such as semiconductor substrates or glass substrates, are typically processed using plasma processing chambers to perform various process steps during the manufacture of the resultant devices, e.g., integrated circuits or flat panel displays. These plasma-enhanced semiconductor processes are well known to those skilled in the art. An important aspect of this manufacturing process is the handling of the substrate wafer during its overall processing. Typically, the handling and transport of the wafer from one particular process to another is highly automated. As is known in the art, one of the steps that is typically automated is the removal of the wafer from a plasma processing chamber after the processing of the wafer within the chamber. Before removal of the wafer from the plasma processing chamber can occur, the wafer must first be released from the chuck that secures it during plasma processing.

The present invention provides methods and apparatus for dechucking a semiconductor wafer from an electrostatic chuck.

SUMMARY OF THE INVENTION

To achieve the foregoing and in accordance with the purpose of the present invention a method of dechucking a wafer held onto an electrostatic chuck by an electrostatic charge is provided. The electrostatic clamping voltage is removed. An essentially argon free dechucking gas is provided. A dechucking plasma is formed from the dechucking gas. The dechucking plasma is stopped. In another manifestation of the invention a method of dechucking a wafer, on which a silicon oxide based low-k is formed, held onto an electrostatic chuck by an electrostatic charge is provided. The electrostatic clamping voltage is removed. An argon free dechucking gas is provided. A dechucking plasma is formed from the dechucking gas. The low-k dielectric layer is etched. The dechucking plasma is stopped. The wafer is lifted.

DETAILED DESCRIPTION OF THE PREFERRED EMBODIMENTS

Figure 1:
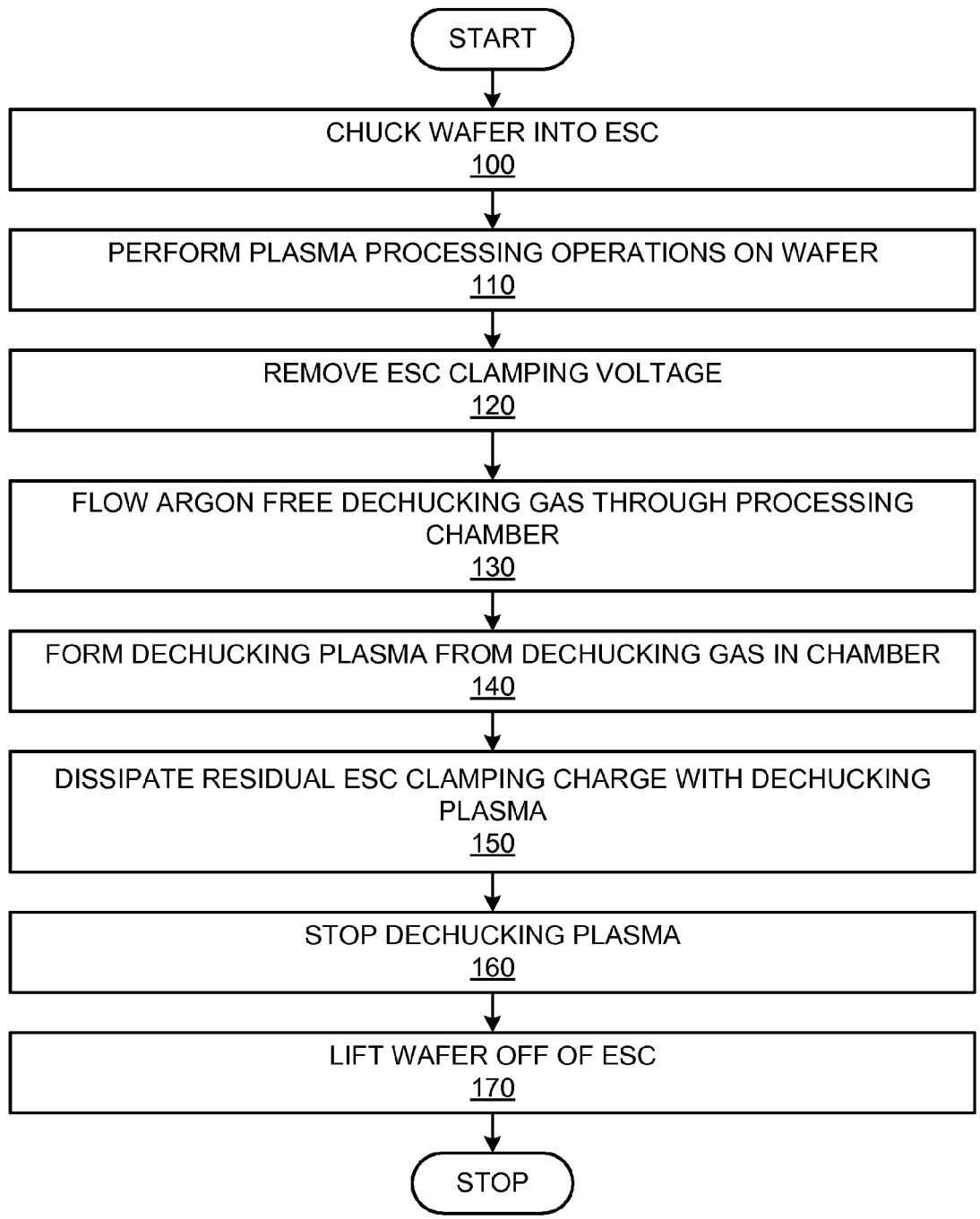
FIG. 1 is a simplified process diagram of the plasma dechuck process.

During plasma processing, a wafer is commonly held in position inside the plasma processing chamber by a chuck. There are several types of chucks available, but one very common type of chuck uses an electrostatic clamping charge to hold the substrate in place. The electrostatic chuck, or "ESC", generates the electrostatic clamping charge by applying an electrostatic clamping voltage to the chuck. When the clamping voltage is removed, the electrostatic charge slowly dissipates over time. In a production environment, however, this dissipation time results in a delay and it is desirable to minimize this delay and begin processing the next substrate as soon as possible.

In order to remove the substrate from the plasma processing chamber, the substrate is typically lifted off of the ESC using a substrate lifting arrangement, usually consisting of a set of pins that push through the ESC and lift the substrate up from below. This allows a substrate transport mechanism to grasp the substrate and transport the substrate to the next process step. However, in some cases, the substrate may tend to stick to the ESC. This sticking problem is caused by a residual electrical charge which remains on the substrate after clamping voltage is removed and that has not been given sufficient time to dissipate. If the substrate sticks to the chuck, the substrate may have a tendency to pop loose from the chuck as the lifting arrangement lifts the substrate. This popping off may cause the substrate to be displaced relative to its expected position for grasping by the transport mechanism. If the substrate is not in its proper location, the transport mechanism may not be able to properly grasp the substrate and the overall system will have to be stopped so that the displaced substrate can be manually retrieved. In some cases, the substrate wafer can be physically damaged by the lifting mechanism if the static charge is insufficiently dissipated before lifting begins.

Various approaches have been used to avoid the wafer sticking problem. In one such approach, an additional step is added after processing of the wafer within the plasma processing chamber. This additional step, referred to as plasma dechucking, involves striking a plasma within the chamber which acts as a conductive path for the charge on the wafer to discharge to the wall of the chamber. However, this approach frequently damages the features on wafers, which is undesirable from a quality standpoint.

An invention is described for providing, in a plasma processing chamber, a method for controlling the discharge of any electrical charge remaining on a substrate through the use of a plasma formed from an argon free gas, which produces low vacuum ultraviolet (VUV) emission intensity. In the following description, numerous specific details are set forth in order to provide a thorough understanding of the present invention. It will be obvious, however, to one skilled in the art, that the present invention may be embodied in a wide variety of specific configurations. Also, well known processes have not been described in detail in order not to unnecessarily obscure the present invention.

The inventive argon free plasma dechucking technique may be performed in any known plasma processing apparatuses such as, but not limited to, those adapted for dry etching, electron cyclotron resonance, or the like. Note that this is true irrespective of whether energy to the plasma is delivered through capacitively coupled parallel electrode plates, through ECR microwave plasma sources, or through inductively coupled RF sources such as helicon, helical resonators, and transformer coupled plasma. These processing systems, among others, are readily available commercially.

FIG. 1 is a process diagram that illustrates the typical steps involved in one embodiment of the method invented. During the chucking step (step 100), a semiconductor wafer is placed on an electrostatic chuck (ESC) located in a plasma processing chamber in preparation for one or more plasma processing operations, such as etching. The chuck is then energized with a clamping voltage, which produces a clamping charge on the surface of the ESC that holds the wafer firmly in place in preparation for processing. After the chucking step is completed, the plasma processing step (step 110) is performed, which comprises flowing a plasma processing gas through the plasma processing chamber, forming a plasma from the plasma processing gas, using the plasma in a plasma processing operation on the wafer, and then stopping the plasma. After the plasma processing operation is finished, the plasma is stopped. Once plasma processing (step 110) is complete, the ESC clamping voltage is removed (step 120). After the clamping voltage is removed, an argon free dechucking gas is flowed through the chamber (step 130). After the argon free dechucking gas is introduced into the chamber, a dechucking plasma is formed from the gas (step 140). The dechucking plasma conducts the residual clamping charge to the walls of the plasma processing chamber, dissipating it (step 150). After the charge has been dissipated to the desired level, the plasma is turned off (step 160). The wafer is then lifted off of the ESC in preparation for the next processing step (step 170).

Figure 2:
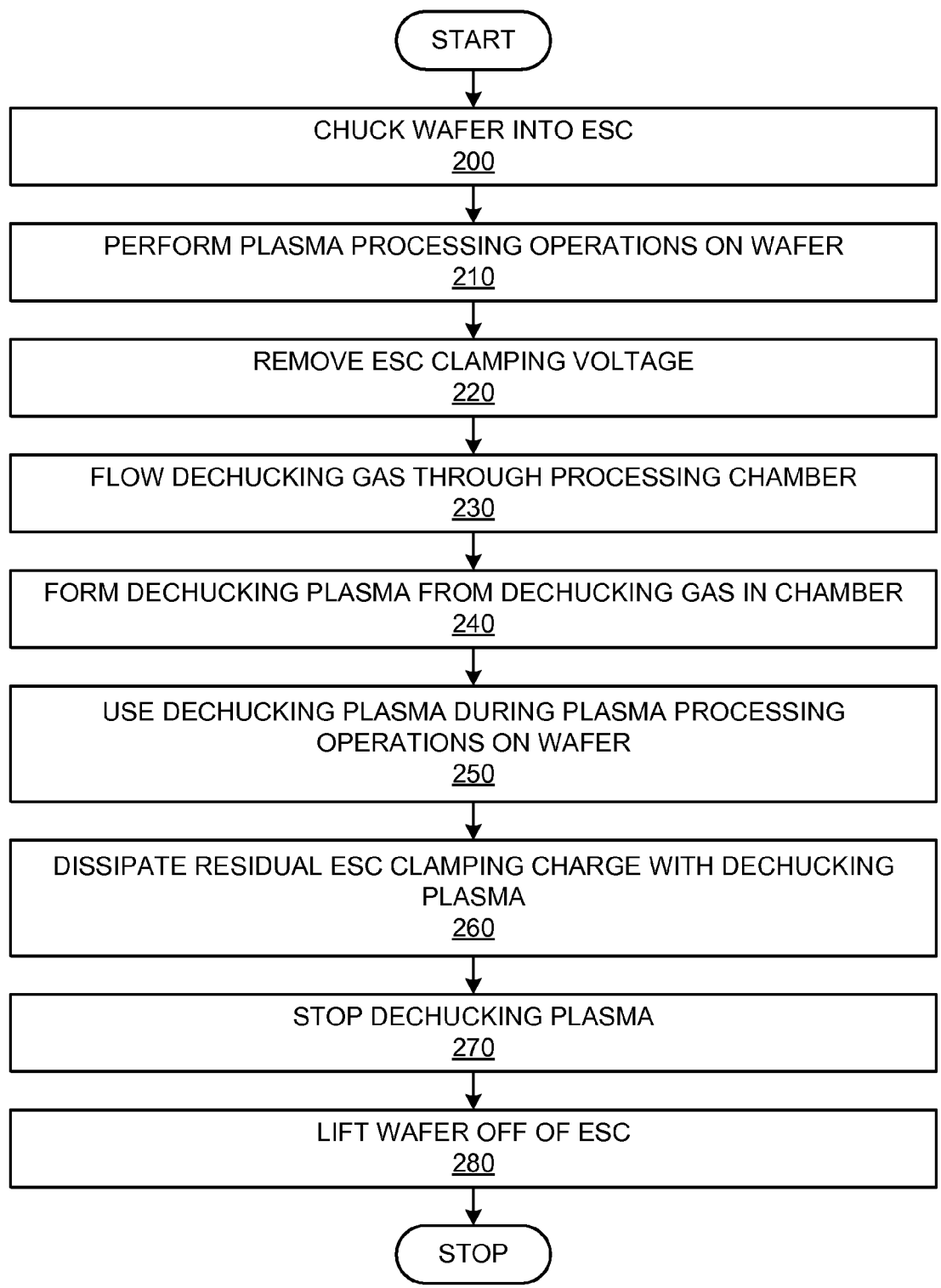
FIG. 2 is a simplified process diagram of the plasma dechuck process wherein the dechuck gas is also used during plasma processing.

FIG. 2 is a process diagram that illustrates an example of the embodiment shown in FIG. 1. During the chucking step (step 200), a semiconductor wafer is placed on an electrostatic chuck (ESC) located in a plasma processing chamber in preparation for one or more plasma processing operations, such as etching. The chuck is then energized with a clamping voltage, which produces a clamping charge on the surface of the ESC that holds the wafer firmly in place in preparation for processing. After the chucking step is completed, the plasma processing step (step 210) is performed, which consists of flowing a plasma processing gas through the plasma processing chamber and forming a plasma with it that is then used to process the wafer. The ESC clamping voltage is then removed (step 220) and an argon free dechucking gas is flowed through the chamber (step 230). While the argon free dechucking gas is flowed through the chamber, a dechucking plasma is formed from the gas (step 240). The dechucking plasma is then used in further plasma processing of the wafer (step 250). Once plasma processing using the dechucking plasma is complete, the dechucking plasma is maintained in the chamber and conducts any remaining ESC clamping charge to the walls of the chamber (step 260). After the charge has been dissipated to the desired level, the plasma is turned off (step 270). The wafer is then lifted off of the ESC in preparation for the next processing step (step 280).

Figure 3:
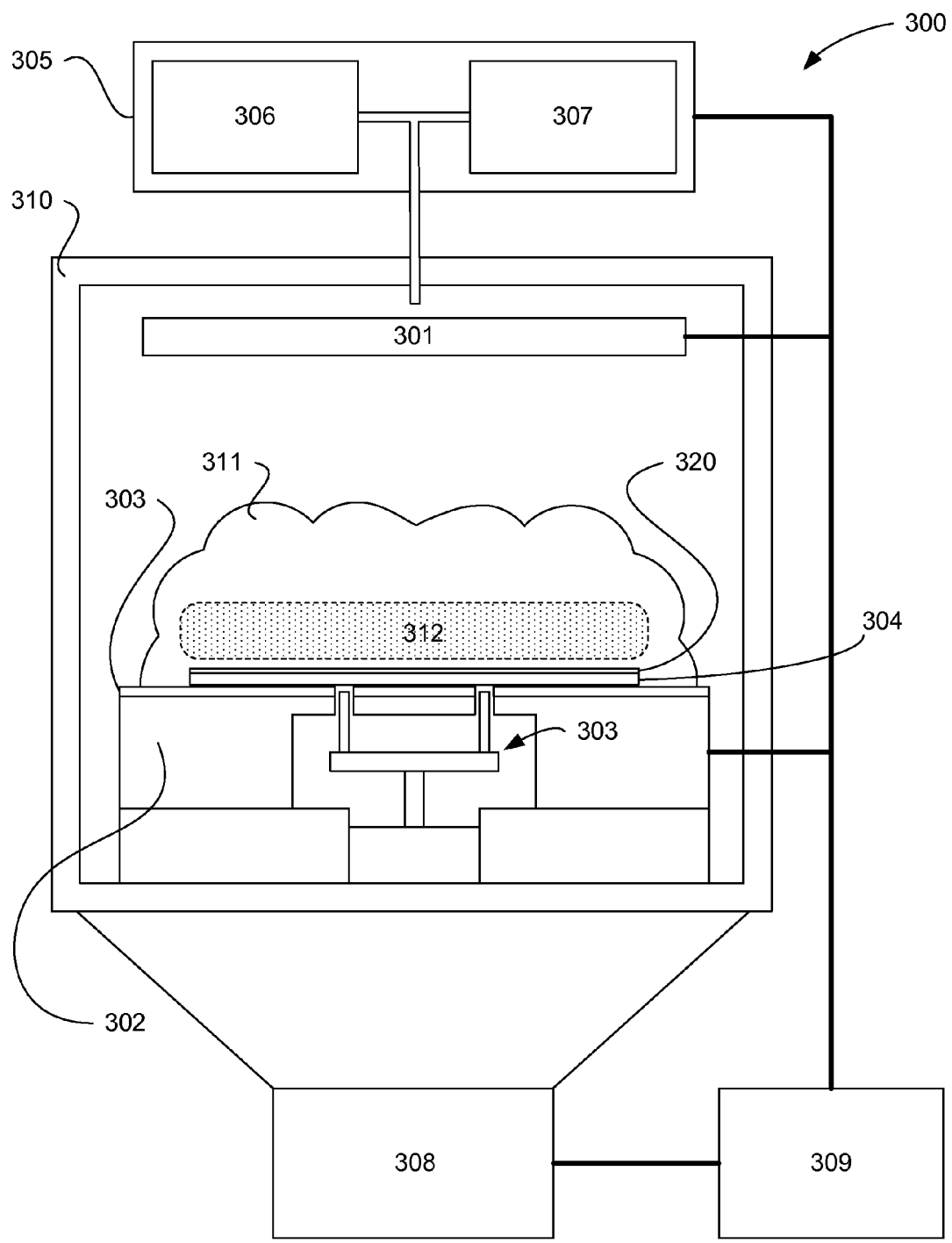
FIG. 3 is a cross sectional view illustrating, in one embodiment, the processing chamber, ESC, controller, substrate, electrodes, gas reservoirs, and lifting arrangement.

FIG. 3 is a schematic view of an embodiment of a plasma processing system 300 that may be used in practicing the invention. In one or more embodiments of the invention, the plasma processing system comprises an upper electrode 301, lower electrode 302, and lifting mechanism 303, which are all enclosed within a chamber 310. The lower electrode 302 incorporates an electrostatic chuck (ESC) surfaced with a dielectric material to facilitate clamping a semiconductor wafer 304, on which a low-k layer 320 is formed, in place inside the chamber 310; such a wafer is held in place on the ESC during processing operations.

A gas distribution system 305 is connected to the plasma processing system 300 such that gas from the distribution system can be flowed through the chamber 310 where the substrate wafer 304 is held on the ESC 302. The gas distribution system is comprised of one or more processing gas sources 306, each containing gas used during plasma processing operations inside the chamber 310. The gas distribution system 305 also contains a dechucking gas source 307, which contains an argon free dechucking gas 311 used during the plasma dechuck process. The gas distribution system is configured to flow desired quantities and types of gas into the plasma processing system. An exhaust pump 308 is connected to the chamber 310 to facilitate flow of the plasma processing gas or dechucking gas through the chamber.

A controller 309 is connected to the plasma processing system 300 and is configured to provide control of the upper electrode 301, lower electrode 302, gas distribution system 305, electrostatic chuck 302, lifting mechanism 303, and exhaust pump 308. The controller 309 may control other systems as well.

Figure 4A:
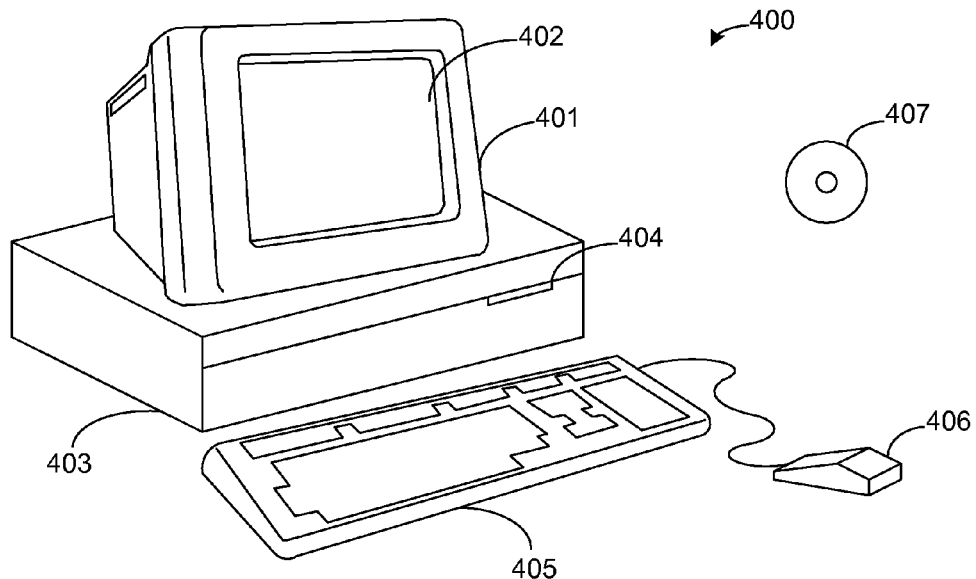
FIGS. 4A-B illustrate a computer system, which is suitable for implementing a controller used in embodiments of the present invention.
Figure 4B:
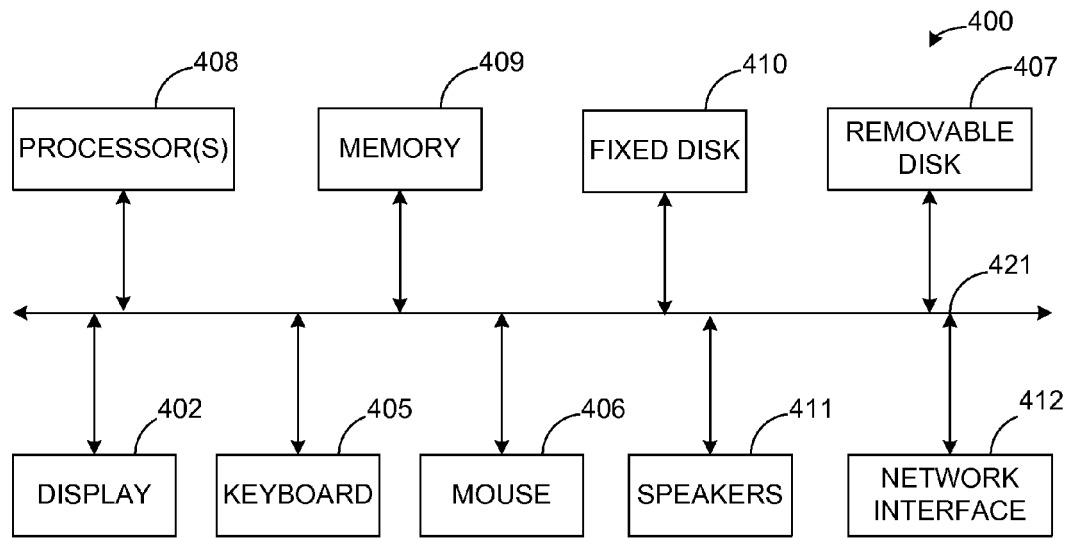

FIGS. 4A and 4B illustrate a computer system, which is suitable for implementing the controller 309 used in one or more embodiments of the present invention. FIG. 4A shows one possible physical form of the computer system 400. Of course, the computer system may have many physical forms ranging from an integrated circuit, a printed circuit board, and a small handheld device up to a huge super computer. Computer system 400 includes a monitor 401, a display 402, a housing 403, a disk drive 404, a keyboard 405, and a mouse 406. Disk 407 is a computer-readable medium used to transfer data to and from computer system 400.

FIG. 4B is an example of a block diagram for computer system 400. Attached to system bus 421 are a wide variety of subsystems. Processor(s) 408 (also referred to as central processing units, or CPUs) are coupled to storage devices, including memory 409. Memory 409 includes random access memory (RAM) and read-only memory (ROM). As is well known in the art, ROM acts to transfer data and instructions uni-directionally to the CPU, and RAM is used typically to transfer data and instructions in a bi-directional manner. Both of these types of memories may include any suitable of the computer-readable media described below. A fixed disk 410 is also coupled bi-directionally to CPU 408; it provides additional data storage capacity and may also include any of the computer-readable media described below. Fixed disk 410 may be used to store programs, data, and the like and is typically a secondary storage medium (such as a hard disk) that is slower than primary storage. It will be appreciated that the information retained within fixed disk 410 may, in appropriate cases, be incorporated in standard fashion as virtual memory in memory 409. Removable disk 407 may take the form of any of the computer-readable media described below.

CPU 408 is also coupled to a variety of input/output devices, such as display 402, keyboard 405, mouse 406, and speakers 411. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 408 optionally may be coupled to another computer or telecommunications network using network interface 412. With such a network interface, it is contemplated that the CPU might receive information from the network, or might output information to the network in the course of performing the above-described method steps. Furthermore, method embodiments of the present invention may execute solely upon CPU 408 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

To implement the method using the embodiment depicted in FIG. 3, the semiconductor wafer 304 is inserted into the plasma processing system 300. The controller 309 then energizes the ESC 302 with a clamping voltage, which holds the wafer 304 in place during processing with an electrostatic clamping charge (step 100). The controller 309 then directs the gas distribution system 305 to flow a plasma processing gas through the chamber 310 from processing gas source 306. The controller also directs exhaust pump 308 to begin pumping processing gas out of the chamber so as to facilitate a controlled flow of processing gas through the chamber. The controller 309 also provides power to the upper 301 and lower electrodes 302, causing them to form a plasma from the plasma processing gas in the chamber 310. The plasma is used during plasma processing operations (step 110). An example of such a plasma process would be for etching the low-k dielectric layer 320 to provide an etched low-k dielectric layer. After plasma processing, the controller 309 removes the clamping voltage from the ESC (step 120). The controller then directs the gas distribution system 305 to flow argon free dechucking gas through the chamber from dechucking gas source 307 (step 130). The dechucking gas 311 in the chamber 310 is then formed into a dechucking plasma 312 (step 140). The dechucking plasma 312 is maintained until the residual clamping charge holding the wafer 304 onto the ESC 302 is sufficiently dissipated to allow for safe removal of the wafer from the ESC (step 150). The controller 309 then stops the plasma (step 160) and activates the lifting mechanism 303 to raise the wafer 304 off of the ESC (step 170).

The dechucking gas has been identified as being an argon free gas.

It has been found that argon containing dechucking gases cause VUV radiation, which causes significant feature damage to wafer features, such as trenches and vias, during plasma dechucking operations. This feature damage is undesirable, and by using an argon free gas, the damage due to VUV is minimized. N2 (nitrogen), H2 (hydrogen), and CF4 (tetrafluoromethane) are all examples of argon free gases.

An example of the inventive dechucking process provides a chamber pressure of 50 mTorr. An argon free dechucking gas of 400 sccm N2 is provided into the chamber (step 130). 50 watts of RF power at 27 MHz is provided for 11 seconds to form the dechucking gas into a plasma, which removes the residual ECS voltage (steps 140 and 150).

In various embodiments, the removal of the ESC clamping voltage (step 120) may be performed during the flowing of the dechucking gas step (step 130) or during the forming of the dechucking plasma step (step 140).

In a preferred embodiment of the invention, the reduced wafer damage is reduced damage to an etched low-k dielectric layer on the wafer, where one or more layers may be placed between the low-k dielectric layer and the wafer. Preferably, the low-k dielectric layer is a silicon oxide based material with carbon for providing the low-k. In such an embodiment, wafer damage to the low-k dielectric layer caused by a dechucking gas with argon would be carbon depletion, silanol formation, or other damage that increase the dielectric constant. The use of the argon free dechucking gas minimizes such damage. For a low-k dielectric layer, k<3.0.

More generally, the various embodiments may use an essentially argon free dechucking gas. An essentially argon free dechucking gas has such a small amount of argon that wafer damage during dechucking is minimized, which is preferably less than 1% argon by flow. More preferably, essentially argon free dechucking gas is less than 0.01% argon by flow.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of dechucking a wafer held onto an electrostatic chuck, incorporated in a lower electrode, by an electrostatic charge comprising:
   removing the electrostatic clamping voltage;
   providing an essentially argon free dechucking gas;
   forming a dechucking plasma from the dechucking gas, by applying power through an upper electrode and the lower electrode; and
   stopping the dechucking plasma.

2. The method of claim 1, wherein the dechucking plasma dissipates the electrostatic charge after the electrostatic clamping voltage is removed.

3. The method of claim 2, wherein the dechucking gas comprises at least one of N2, H2, or CF4, provided at a pressure of about 50 mTorr.

4. The method of claim 3, further comprising a lifting the wafer off of the electrostatic chuck using a set of lifting pins.

5. The method of claim 4, wherein the dechucking plasma formed from the dechucking gas also causes an etching of the wafer.

6. The method of claim 5, wherein a low-k dielectric layer is on the wafer, wherein the etching of the wafer etches the low-k dielectric layer.

7. The method of claim 6, wherein the dechucking gas is argon free.

8. The method of claim 4, wherein a low-k dielectric layer is on the wafer.

9. The method of claim 8, wherein the dechucking gas is argon free.

10. The method of claim 4, wherein the dechucking gas is argon free.

11. The method of claim 1, wherein the dechucking gas is argon free.

12. The method of claim 1, wherein a low-k dielectric layer is on the wafer.

13. The method of claim 1, wherein the dechucking gas comprises at least one of N2, H2, or CF4.

14. The method of claim 1, further comprising a lifting the wafer off of the electrostatic chuck using a set of lifting pins.

15. The method of claim 1, wherein the dechucking plasma formed from the dechucking gas is also used to etch the wafer.

16. The method of claim 1, wherein the removing of the electrostatic clamping voltage occurs during the providing of the dechucking gas.

17. A method of dechucking a wafer, on which a silicon oxide based low-k is formed, held onto an electrostatic chuck, incorporated in a lower electrode, by an electrostatic charge comprising:
- removing the electrostatic clamping voltage;
- providing an argon free dechucking gas;
- forming a dechucking plasma from the dechucking gas, by applying power through an upper electrode and the lower electrode;
- etching the low-k dielectric layer;
- stopping the dechucking plasma; and
- lifting the wafer.

18. The method of claim 17, wherein the dechucking gas comprises at least one of N2, H2, or CF4.

19. The method of claim 17, wherein the removing of the electrostatic clamping voltage occurs during the providing of the dechucking gas.

20. The method of claim 17 wherein the providing an argon free dechucking gas provides a pressure of about 50 mTorr.

* * * * *